United States Patent
Kwon et al.

(10) Patent No.: US 7,517,723 B2
(45) Date of Patent: Apr. 14, 2009

(54) METHOD FOR FABRICATING A FLIP CHIP SYSTEM IN PACKAGE

(75) Inventors: Heung-Kyu Kwon, Suwon-si (KR); Tae-Hun Kim, Asan-si (KR); Jeong-O Ha, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 102 days.

(21) Appl. No.: 11/583,051

(22) Filed: Oct. 19, 2006

(65) Prior Publication Data

US 2007/0161153 A1    Jul. 12, 2007

(30) Foreign Application Priority Data

Jan. 10, 2006    (KR)  ...................... 10-2006-0002635

(51) Int. Cl.
H01L 21/00    (2006.01)
(52) U.S. Cl. ................ 438/108; 438/125; 257/E23.135
(58) Field of Classification Search .......... 257/E21.499, 257/E21.502, E21.503, E21.505, E21.511, 257/E23.135, E23.126; 438/106, 107, 108, 438/125, 126, 127
See application file for complete search history.

(56) References Cited

U.S. PATENT DOCUMENTS

| | | | |
|---|---|---|---|
| 6,916,682 B2* | 7/2005 | Gerber et al. ............... | 438/106 |
| 7,091,061 B2* | 8/2006 | King et al. ................... | 438/107 |
| 7,163,842 B2* | 1/2007 | Karnezos ..................... | 438/108 |
| 7,217,993 B2* | 5/2007 | Nishimura ................... | 257/686 |
| 7,279,785 B2* | 10/2007 | Ha et al. ...................... | 257/686 |
| 7,306,973 B2* | 12/2007 | Karnezos ..................... | 438/109 |
| 7,378,298 B2* | 5/2008 | Lo .............................. | 438/108 |
| 2006/0145327 A1* | 7/2006 | Punzalan et al. ............ | 257/686 |

FOREIGN PATENT DOCUMENTS

| | | |
|---|---|---|
| JP | 2002-270757 | 9/2002 |
| JP | 2003-197849 | 7/2003 |
| KR | 1020010016322 | 12/2000 |
| KR | 1020030077180 | 3/2002 |

* cited by examiner

Primary Examiner—Walter L Lindsay, Jr.
(74) Attorney, Agent, or Firm—Volentine & Whitt, PLLC

(57) ABSTRACT

Embodiments of the invention provide a method for fabricating a system in package. In one embodiment, the method comprises preparing a printed circuit board (PCB) strip comprising a plurality of individual PCBs, stacking a plurality of first semiconductor chips and forming an encapsulant on a first surface of a first individual PCB of the plurality of individual PCBs to form a first semiconductor chip stack structure comprising a first semiconductor chip stack, and performing a first test adapted to test one of the first semiconductor chips in the first semiconductor chip stack. The method further comprises flip chip bonding a second semiconductor chip to a second surface of the first individual PCB if the first semiconductor chip stack structure meets a test standard based on a result of the first test, and dividing the first semiconductor chip stack structure to form a system in package.

20 Claims, 9 Drawing Sheets

METHOD FOR FABRICATING A FLIP CHIP SYSTEM IN PACKAGE

BACKGROUND

1. Field of the Invention

Embodiments of the invention relate to a method for fabricating a system in package. In particular, embodiments of the invention relate to a method for fabricating a flip chip system in package.

This application claims priority to Korean Patent Application No. 2006-2635, filed on Jan. 10, 2006, the subject matter of which is hereby incorporated by reference in its entirety.

2. Description of Related Art

Electronics manufacturers are continually seeking new designs, fabrication methods, and fabrication techniques for semiconductor devices in an effort to produce products that are smaller, lighter, faster, more efficient, more capable, and/or superior in performance, all at a relatively low cost. Fabrication techniques for reducing the size of semiconductor devices include techniques for reducing the size of components in a semiconductor device, such as the System On Chip (SOC) technique, for example, and techniques for integrating different kinds of chips into a single device, such as the System In Package (SIP) technique, for example.

A package manufactured using the SIP technique, such as a flip chip system in package, for example, may include a printed circuit board (PCB) having one surface on which semiconductor memory chips are disposed and another surface on which a semiconductor logic chip is disposed. For convenience of description, as used here, the term "system in package" refers to flip chip systems and similarly packaged systems.

FIG. (FIG.) 1A is a cross-sectional view of a conventional system in package strip 500. FIG. 1B is a cross-sectional view of a conventional individual system in package 200. FIG. 2 is a flow chart of a method for fabricating a conventional individual flip chip system in package.

Referring to FIGS. 1A and 2, a PCB strip 100 having an upper surface and a lower surface may be prepared, and PCB strip 100 may comprise a plurality of individual PCBs 10. A plurality of first semiconductor memory chips 1 may be stacked on an upper surface of an individual PCB 10 using an adhesive 4. Bonding wires 3 may connect ball bumps 5 of first semiconductor memory chips 1 to substrate pads 20 of individual PCB 10.

An encapsulant 60 may seal first semiconductor memory chips 1 and bonding wires 3. Conductive balls 40 may be attached to a lower surface of individual PCB 10. Alternatively, conductive balls 40 may be attached after attaching a semiconductor logic chip 2 to the individual PCB.

Semiconductor logic chip 2 may be flip chip bonded to the lower surface of individual PCB 10. Semiconductor logic chip 2 may be electrically connected to individual PCB 10 using conductive bumps 50. An underfill material 70 may be provided between semiconductor logic chip 2 and the lower surface of individual PCB 10. Fabrication of a conventional system in package strip 500 may then be complete, as shown in FIG. 1A. Conventional system in package strip 500 may then be divided into individual system in packages to form an individual system in package 200, as shown in FIG. 1B.

Next, first semiconductor memory chips 1 and semiconductor logic chip 2 disposed in individual system in package 200 may be tested and then individual system in package 200 may be sorted in accordance with the test result. If individual system in package 200 passes the test, individual system in package 200 may then be incorporated with a host device (e.g., a completed product).

Conventionally, semiconductor chips disposed in a system in package must be individually tested as any faulty chip within the system in package will dramatically impact production yields. That is, even a single faulty chip within a system in package will typically cause the entire collection (e.g., the stack) of chips in the system in package to fail.

One solution to this ensuring reliability problem has been to stack packages, rather than individual chips. However, a stack of packages is significantly thicker than a stack of chips. Hence, this proposed solution cuts against the important goal of reducing the size of electronic devices, such as mobile communication products, for example.

SUMMARY OF THE INVENTION

Embodiments of the invention provide a method for fabricating a system in package using a reliable semiconductor memory chip package without increasing the thickness of the package.

In one embodiment, the invention provides a method for fabricating a system in package. The method comprises preparing a printed circuit board (PCB) strip having a first surface and a second surface, the PCB strip comprising a plurality of individual PCBs electrically isolated from one another; stacking a plurality of first semiconductor chips and forming an encapsulant on a first surface of a first individual PCB of the plurality of individual PCBs to form a first semiconductor chip stack structure comprising a first semiconductor chip stack corresponding to the first individual PCB; and performing a first test adapted to test one of the first semiconductor chips in the first semiconductor chip stack. The method further comprises flip chip bonding a second semiconductor chip to a second surface of the first individual PCB if the first semiconductor chip stack structure meets a test standard based on a result of the first test, and dividing the first semiconductor chip stack structure to form a system in package after selectively flip chip bonding the second semiconductor chip to the second surface of the first individual PCB.

In another embodiment, the invention provides a method for fabricating a system in package. The method comprises preparing a printed circuit board (PCB) strip having a first surface and a second surface, the PCB strip comprising a plurality of individual PCBs electrically isolated from one another; stacking a plurality of first semiconductor chips and forming an encapsulant on a first surface of a first individual PCB of the plurality of individual PCBs to form a first semiconductor chip stack structure comprising a first semiconductor chip stack corresponding to the first individual PCB; and performing a first test adapted to test one of the first semiconductor chips in the first semiconductor chip stack. The method further comprises dividing the first semiconductor chip stack structure to form a semiconductor memory chip stack package comprising the first individual PCB, sorting the semiconductor memory chip stack package in accordance with a result of the first test; and flip chip bonding a second semiconductor chip to a second surface of the first individual PCB if the semiconductor memory chip stack package meets a test standard based on the result of the first test.

BRIEF DESCRIPTION OF THE DRAWINGS

Embodiments of the invention will be described with reference to the accompanying drawings, in which like reference symbols indicate like elements throughout. In addition, the drawings are not drawn to scale. In the drawings.

DESCRIPTION OF EMBODIMENTS

Figure 3A:
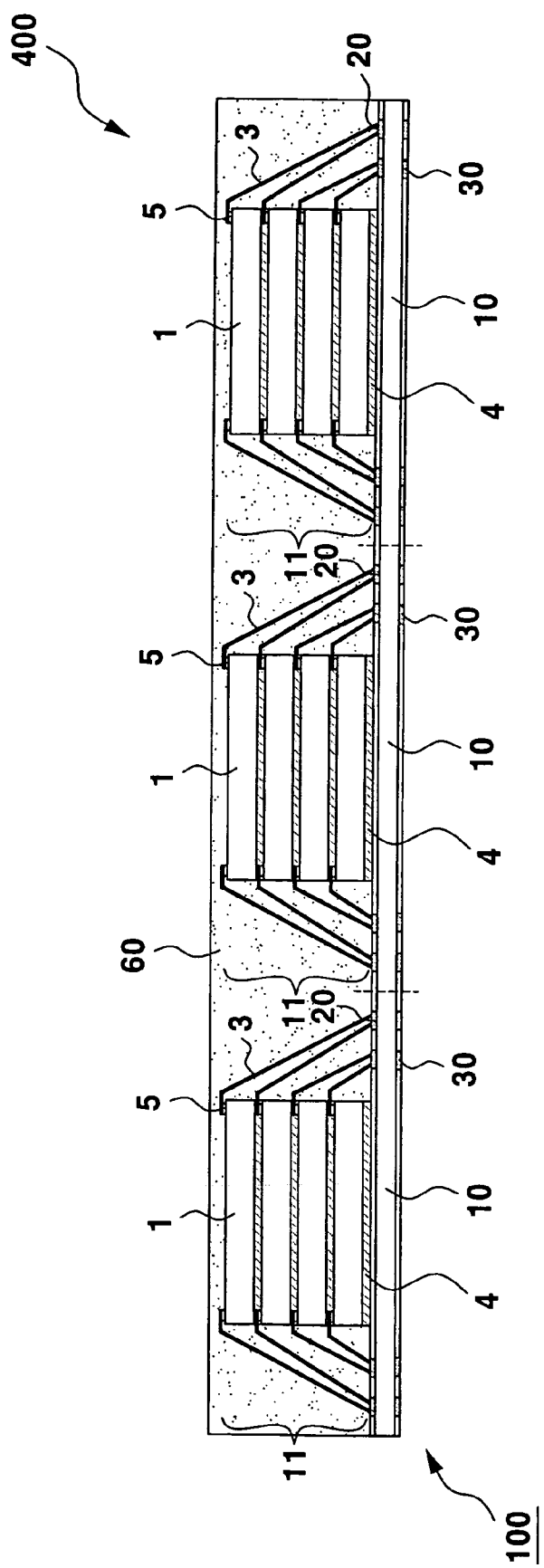
FIGS. 3A and 3B are cross-sectional views illustrating stages in a method for fabricating a system in package in accordance with an embodiment of the invention.
Figure 3B:
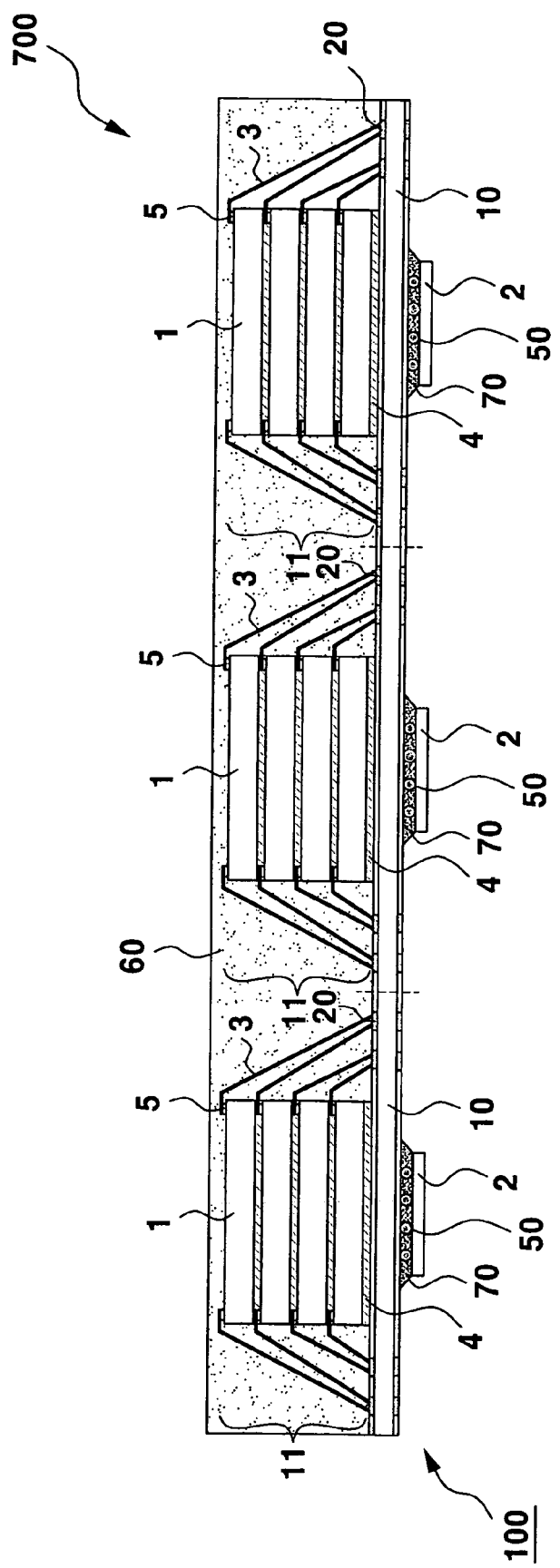
Figure 4:
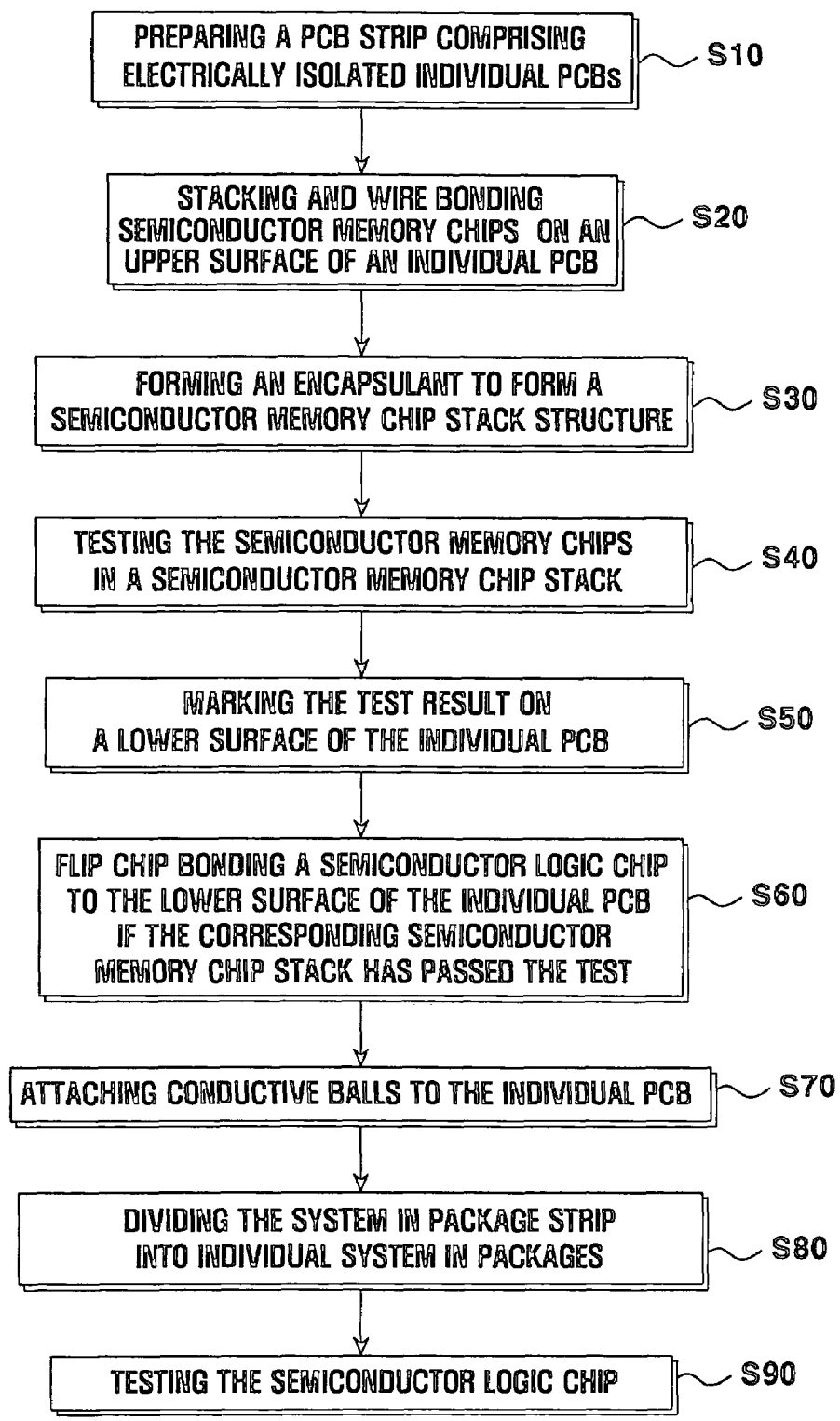
FIG. 4 is a flow chart of a method for fabricating a system in package in accordance with an embodiment of the invention.

FIGS. 3A and 3B are cross-sectional views illustrating stages in a method for fabricating a system in package in accordance with an embodiment of the present invention. FIG. 4 is a flow chart of a method for fabricating a system in package in accordance with an embodiment of the invention. For convenience of description, the method of FIG. 4 will primarily be described with particular reference to a first semiconductor memory chip stack 11 (comprising first semiconductor memory chips 1), a first individual PCB 10, and a semiconductor logic chip 2, though multiple of each of the preceding elements are shown in FIGS. 3A and/or 3B.

Referring to FIG. 4, the method of FIG. 4 for fabricating the system in package may comprise preparing a PCB strip 100 comprising an upper surface and a lower surface. PCB strip 100 may comprise a plurality of individual PCBs 10, and individual PCBs 10 may be electrically isolated from one another.

Individual PCBs 10 may be electrically connected to one another by plating bars in an initial PCB strip 100. When testing an individual PCB 10, electrical interconnections between individual PCBs 10, such as plating bars, for example, should be removed. The process for removing a plating bar may comprise use of a chemical process to perform an etch back, and/or use of a mechanical process using a router. Alternatively, a PCB strip having no plating bars may be used. A PCB strip having no plating bars may be formed through a barless plating process.

A plurality of first semiconductor memory chips 1 may be stacked on the upper surface of first individual PCB 10 to form first semiconductor memory chip stack 11. Since subsequent wire bonding and encapsulating processes are the same as conventional wire bonding and encapsulating processes, detailed description thereof is omitted here.

Referring to FIG. 3A, a semiconductor memory chip stack structure 400 comprises first semiconductor memory chip stack 11 (comprising first semiconductor memory chips 1) and an encapsulant 60 formed on PCB strip 100 (and thus on first individual PCB 10).

A testing process for performing a first test may be performed on first semiconductor memory chip stack 11 of semiconductor memory chip stack structure 400 by bringing test terminals of a tester into contact with ball lands 30 of first individual PCB 10, which corresponds to first semiconductor memory chip stack 11, or conductive balls 40 attached to ball lands 30 of first individual PCB 10. An individual PCB 10 may be an LGA-type individual PCB 10 or a BGA-type individual PCB 10. An LGA-type individual PCB 10 may be preferable for a flip chip bonding process for a semiconductor logic chip 2.

After the testing process is complete, the resulting first test results (e.g., a pass/fail indication) may be used to identify the proper test bin into which the first semiconductor memory chip stack 11 should be sorted. Alternatively, a total memory capacity indication for semiconductor memory chips 1 of first semiconductor memory chip stack 11, for example, may be determined and marked on first individual PCB 10. This indication may be similarly used to sort tested product. Thus, the results of the first test may be recorded in marking lands (not shown) using ink or ultraviolet rays. A marking process may be performed, for example, on the lower surface of first individual PCB 10 for a flip chip bonding process for semiconductor logic chip 2. The marking lands may be formed concurrently with ball lands 30 during the fabrication of PCB strip 100. A method for forming the marking lands may be the same as a method for forming ball lands 30.

A faulty chip among first semiconductor memory chips 1 of first semiconductor memory chip stack 11, which corresponds to first individual PCB 10, may cause all of the first semiconductor memory chips 1 of first semiconductor memory chip stack 11 to be defective, or reduce the memory capacity of first semiconductor memory chip stack 11.

Assuming that four first semiconductor memory chips 1 having a combined memory capacity of 1 GB are stacked on first individual PCB 10 to form first semiconductor memory chip stack 11, if one or two of the first semiconductor memory chips 1 are faulty, a semiconductor memory chip stack having a combined memory capacity of 512 MB may be available for use. Additionally, if one semiconductor memory chip is good, a semiconductor memory chip stack having a memory capacity of 256 MB may be available for use.

Therefore, if the test standard for the first test accepts only semiconductor memory chip stacks 11 that have a total memory capacity of 1 GB, a marking may be made indicating whether or not any of first semiconductor memory chips 1 of first semiconductor memory chip stack 11 are faulty. If the test standard for the first test accepts semiconductor memory chip stacks 11 that have a reduced memory capacity, a marking may be made indicating the number of good first semiconductor memory chips 1 in first semiconductor memory chip stack 11.

After the result of the first test is marked on the lower surface of first individual PCB 10, a first semiconductor logic chip 2 may be selectively flip chip bonded to first individual PCB 10 in accordance with the test standard for the first test.

The result of the first test may be marked on the lower surface of first individual PCB 10 to eliminate the need for an additional process to invert PCB strip 100.

Semiconductor logic chips 2 may only be attached to individual PCBs 10 corresponding to semiconductor memory chip stacks 11 (of semiconductor memory chip stack structure 400) that meet the test standard for the first test to prevent wasting semiconductor chips and to improve the productivity of the process for producing system in packages. That is, first semiconductor logic chip 2 may be flip chip bonded to a so-called known good package (KGP). Thus, production rates may be increased.

Figure 1A:
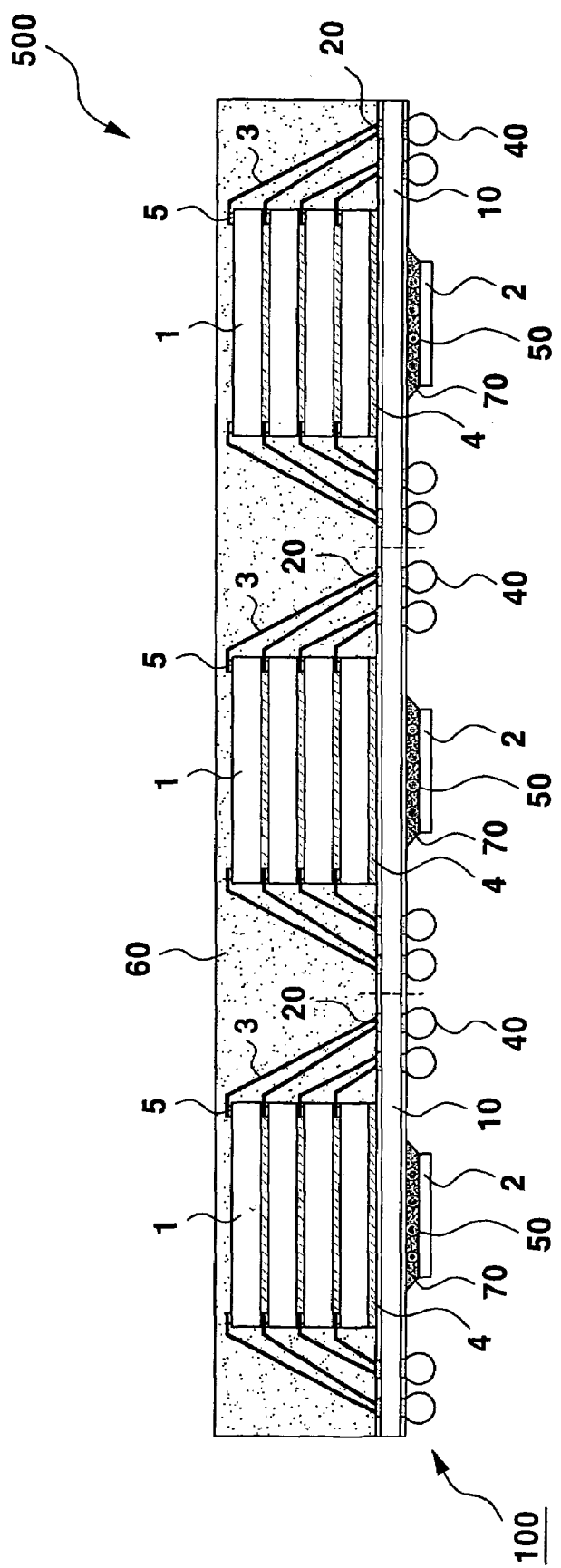
FIG. 1A is a cross-sectional view of a conventional system in package strip.
Figure 1B:
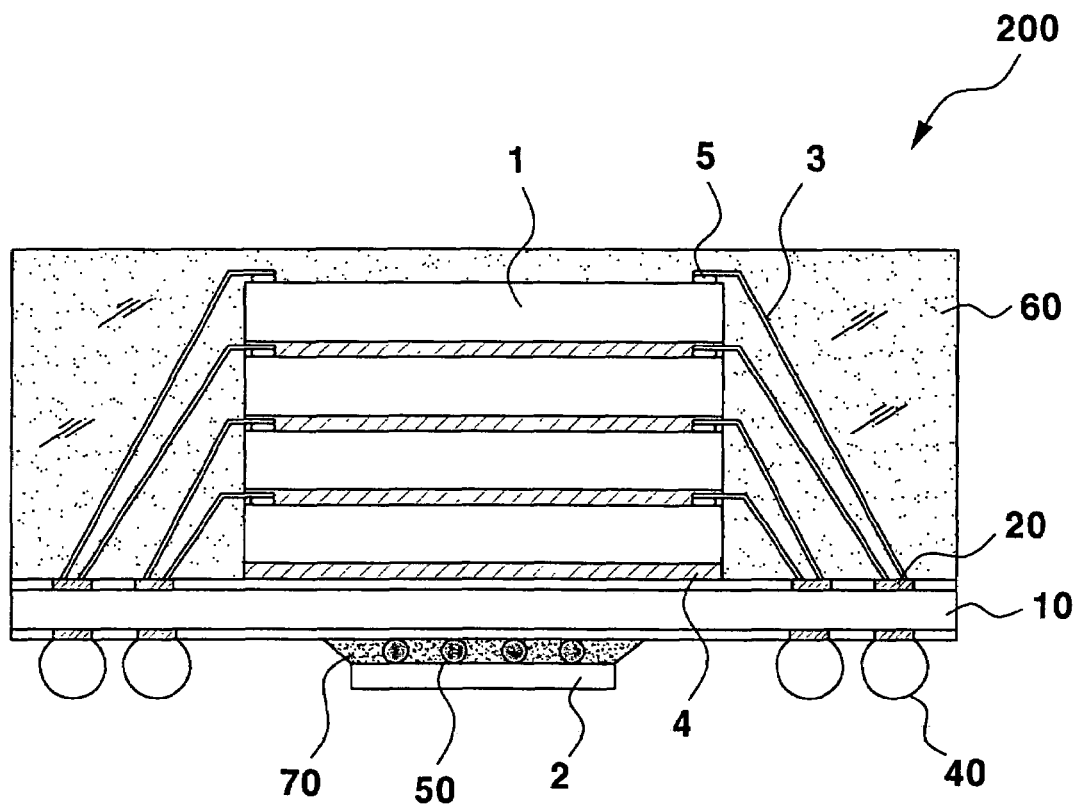
FIG. 1B is a cross-sectional view of a conventional individual system in package.
Figure 2:
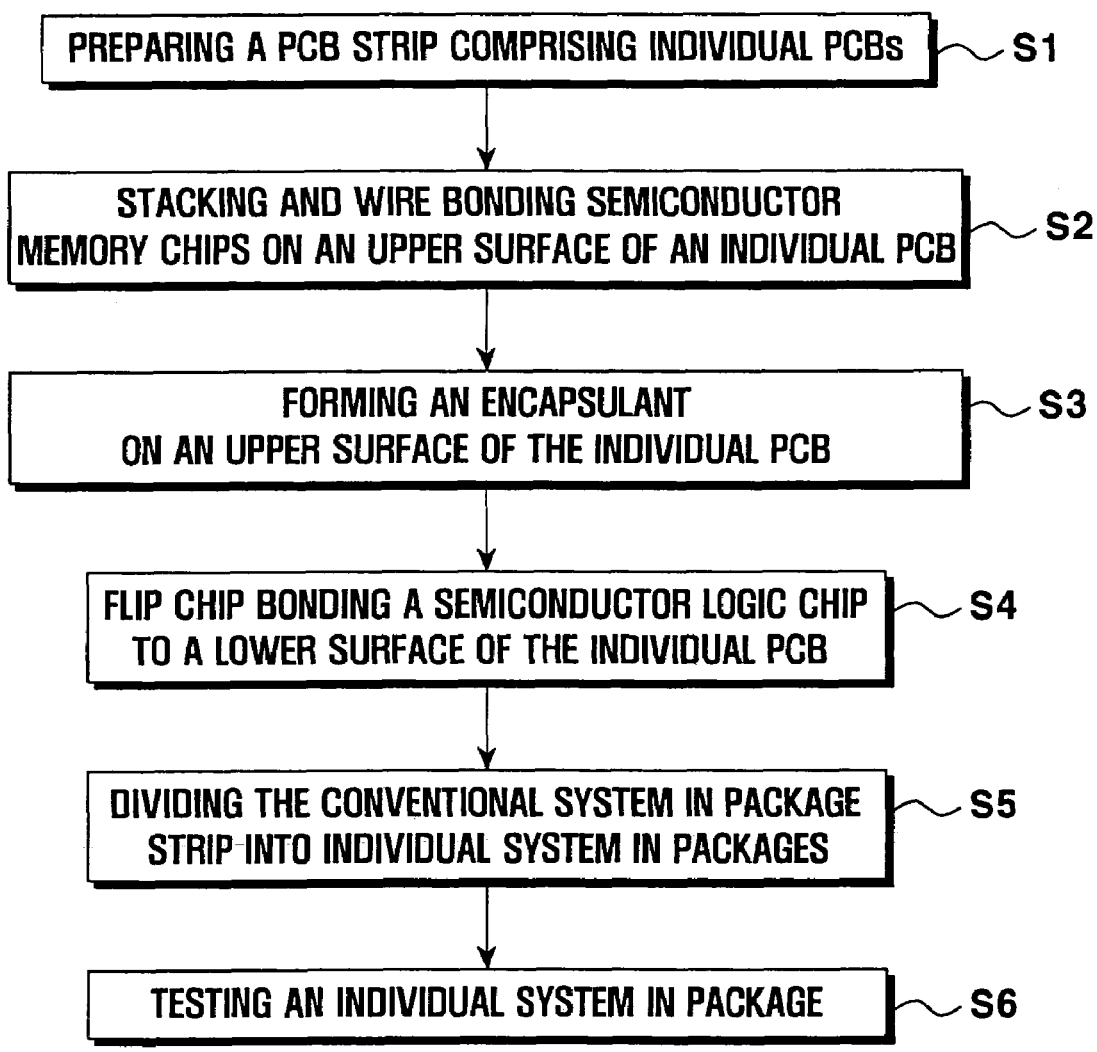
FIG. 2 is a flow chart of a method for fabricating a conventional individual system in package.

Next, conductive balls 40 may be attached to ball lands 30 on the lower surface of first individual PCB 10. A system in package strip 700 may have the same structure as conventional system in package strip 500 of FIG. 1A. System in package strip 700 may be divided to form an individual system in package 200. See, e.g., FIG. 1B. As used herein, an "individual system in package" may be referred to as simply a "system in package".

In alternative embodiments, conductive balls 40 may be attached to ball lands 30 before flip chip bonding first semiconductor logic chip 2 to the lower surface of first individual PCB 10.

When individual PCB 10 is a BGA-type PCB, processes for attaching conductive balls 40 to ball lands 30 may be omitted.

Finally, first semiconductor logic chip 2 may be tested; and thus, a system in package may be completed.

Figure 5A:
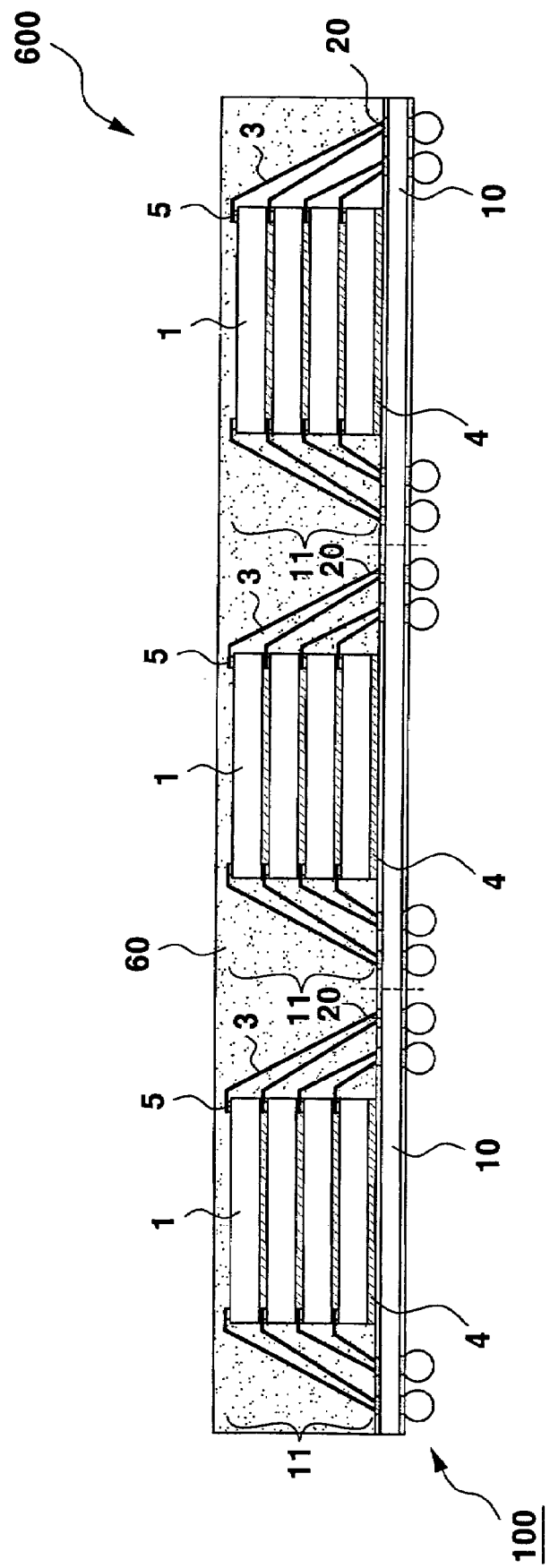
FIGS. 5A and 5B are cross-sectional views illustrating stages in a method for fabricating a system in package in accordance with an embodiment of the invention; and, FIG. 6 is a flow chart of a method for fabricating a system in package in accordance with another example of the present invention.
Figure 5B:
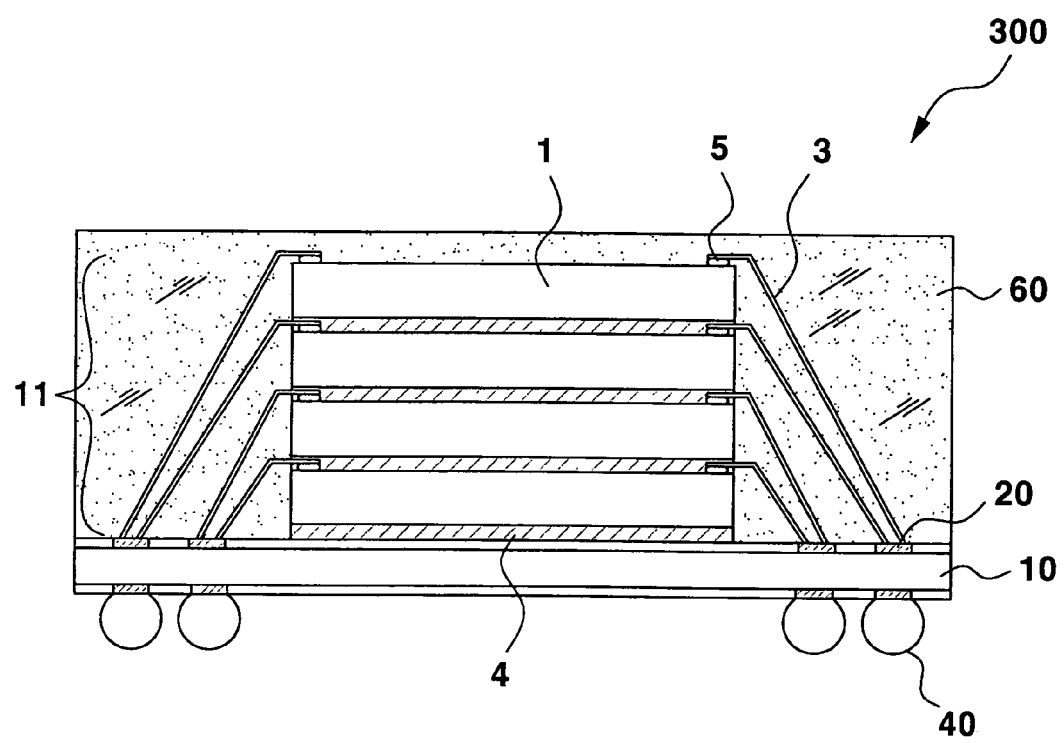
Figure 6:
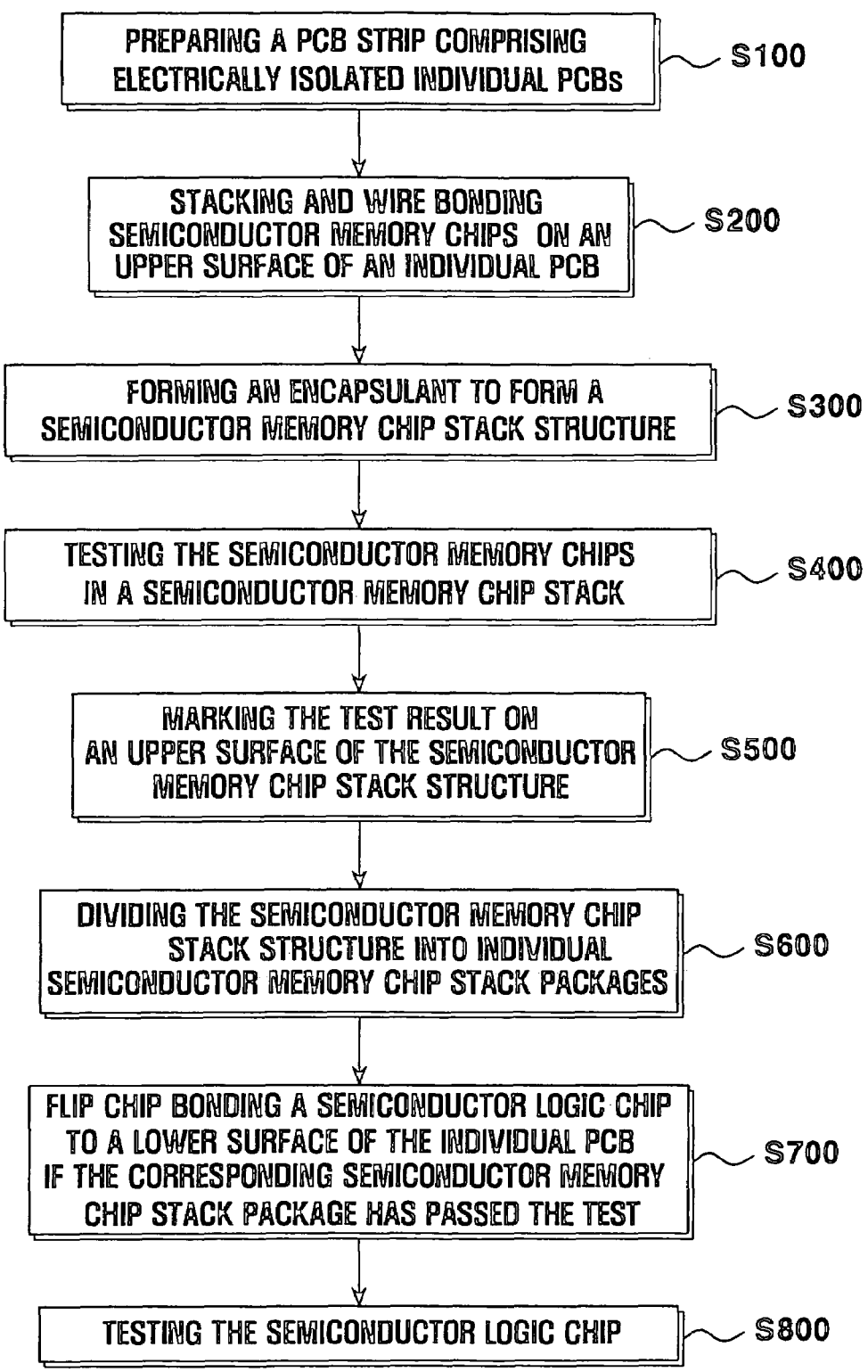

FIGS. 5A and 5B are cross-sectional views illustrating stages in a method for fabricating a system in package in accordance with an embodiment of the invention. FIG. 6 is a flow chart of a method for fabricating a system in package in accordance with an embodiment of the invention.

Steps S100 through S400 of the method of FIG. 6 are the same as steps S10 through S40 of the method of FIG. 4, so a detailed description of steps S100 through S400 will be omitted here. In addition, the method will be described with reference to a first semiconductor memory chip stack 11 (comprising first semiconductor memory chips 1), and a first individual PCB 10, though multiple of the preceding elements are illustrated in FIG. 5A.

Referring to step S500 of FIG. 6, the result of the first test may be marked on a portion of an upper surface of a semiconductor memory chip stack structure 600 corresponding to first semiconductor chip stack 11, which may eliminate the need for forming marking lands. Alternatively, the result of the first test may be marked on a lower surface of first individual PCB 10 in the same manner as in the embodiment described above with reference to FIGS. 3 and 4.

The result of the first test is the same as the result of the first test in the embodiment described above with reference to FIGS. 3 and 4, so a detailed description thereof is omitted here.

A semiconductor memory chip stack package 600 may be divided while recognizing the marked result of the first test. Thus, an individual semiconductor memory chip stack package 300 may be formed, as shown in FIG. 5B. Individual semiconductor memory chip stack package 300 may be sorted in accordance with the result of the first test. A semiconductor logic chip 2 may then be flip chip bonded to individual semiconductor memory chip stack package 300 if it meets the standard of the first test (i.e., if the semiconductor memory chip stack 11 of individual semiconductor memory chip stack package 300 meets the standard of the first test).

A BGA-type first individual PCB 10 may be provided, as shown in FIG. 5A. A process for attaching conductive balls to a PCB may be performed more efficiently on an individual PCB than on a PCB strip. In alternative embodiments, an LGA-type first individual PCB 10 may be used. For example, after performing a first test through a testing process, conductive balls 40 may be attached before dividing semiconductor memory chip stack package 600 into individual packages.

After second semiconductor logic chip 2 is flip chip bonded, fabrication of an individual system in package 200 (see FIG. 1B) may be completed. Semiconductor logic chip 2 in individual system in package 200 may then be tested with a second test. Subsequent processes may then be conventionally performed to complete the system in package 200.

Therefore, semiconductor logic chip 2 may be flip chip bonded to a reliable memory chip package, thereby improving production yield for system in packages.

In a method for fabricating a system in package, in accordance with an embodiment of the invention, semiconductor packages on a PCB strip may be simultaneously fabricated and tested, thereby improving the efficiency of the fabricating process. The method in accordance with embodiments of the invention may guarantee the reliability of semiconductor memory chips in a system in package without an increasing the thickness of the system in package, thereby improving production rates for system in packages without increasing the sizes of the system in packages.

Although embodiments of the invention have been described herein, many variations and/or modifications may be made to the embodiments by those skilled in the art without departing from the scope of the invention as defined by the accompanying claims.

What is claimed is:

1. A method for fabricating a system in package, the method comprising:
   preparing a printed circuit board (PCB) strip having a first surface and a second surface, the PCB strip comprising a plurality of individual PCBs electrically isolated from one another;
   stacking a plurality of first semiconductor chips and forming an encapsulant on a first surface of a first individual PCB of the plurality of individual PCBs to form a first semiconductor chip stack structure comprising a first semiconductor chip stack corresponding to the first individual PCB;
   performing a first test adapted to test one of the first semiconductor chips in the first semiconductor chip stack;
   flip chip bonding a second semiconductor chip to a second surface of the first individual PCB if the first semiconductor chip stack meets a test standard based on a result of the first test;
   performing a second test adapted to test the second semiconductor chip; and,
   dividing the first semiconductor chip stack structure to form a system in package after selectively flip chip bonding the second semiconductor chip to the second surface of the first individual PCB.

2. The method of claim 1, wherein preparing the PCB strip comprises forming a plurality of lands on the second surface of the first individual PCB to form a land grid array (LGA)-type first individual PCB.

3. The method of claim 1, wherein preparing the PCB strip comprises forming a plurality of conductive balls on the second surface of the first individual PCB to form a ball grid array (BGA)-type first individual PCB.

4. The method of claim 2, further comprising attaching conductive balls to the lands after performing the first test.

5. The method of claim 2, further comprising attaching conductive balls to the lands before performing the first test.

6. The method of claim 2, further comprising attaching conductive balls to the lands after selectively flip chip bonding the second semiconductor chip to the second surface of the first individual PCB.

7. The method of claim 1, wherein performing the first test comprises marking the result of the first test on the second surface of the first individual PCB.

8. The method of claim 7, wherein preparing the PCB strip comprises forming a marking land on the second surface of the first individual PCB.

9. The method of claim 8, wherein marking the result of the first test on the second surface of the first individual PCB comprises marking the result of the first test on the marking land.

10. The method of claim 1, wherein preparing the PCB strip comprises providing a PCB strip without plating bars.

11. The method of claim 10, further comprising performing a barless plating process to form the PCB strip without plating bars.

12. The method of claim 1, wherein preparing the PCB strip comprises removing electrical interconnections between the individual POBs using an etch back process.

13. The method of claim 1, wherein preparing the PCB strip comprises removing electrical interconnections between the individual PCBs using a router.

14. The method of claim 1, wherein the first semiconductor chip is a semiconductor memory chip.

15. The method of claim 14, wherein the second semiconductor chip is a semiconductor logic chip.

16. A method for fabricating a system in package, the method comprising:

preparing a printed circuit board (PCB) strip having first and second surfaces, wherein the PCB strip comprises a plurality of individual PCBs including a first individual PCB and a second individual PCB;

stacking a plurality of first semiconductor chips and forming an encapsulant on a first surface of the first individual PCB to form a first semiconductor chip stack structure;

performing a first test on the plurality of first semiconductor chips, wherein the first test comprises marking a result for the first test on a second surface of the first individual PCB;

flip chip bonding a second semiconductor chip to the second surface of the first individual PCB if the plurality of first semiconductor chips passes the first test; and dividing the first semiconductor chip stack structure to form a system in package after flip chip bonding the second semiconductor chip to the second surface of the first individual PCB.

17. The method of claim 16, wherein preparing the PCB strip comprises forming a plurality of lands on the second surface of the first individual PCB to form a land grid array (LGA)-type first individual PCB.

18. The method of claim 16, wherein preparing the PCB strip comprises forming a plurality of conductive balls on the second surface of the first individual PCB to form a ball grid array (BGA)-type first individual PCB.

19. The method of claim 16, wherein preparing the PCB strip comprises forming a marking land on the second surface of the first individual PCB.

20. The method of claim 19, wherein marking the result of the first test on the second surface of the first individual PCB comprises marking the result of the first test on the marking land.

* * * * *